United States Patent
Hayami et al.

(10) Patent No.: US 8,628,640 B2
(45) Date of Patent: Jan. 14, 2014

(54) PLASMA PROCESSING UNIT AND HIGH-FREQUENCY ELECTRIC POWER SUPPLYING UNIT

(75) Inventors: Toshihiro Hayami, Nirasaki (JP);
Masahide Iwasaki, Nirasaki (JP);
Junichi Takahira, Niiza (JP);
Kazuyoshi Watanabe, Niiza (JP);
Shinichi Komatsu, Hanno (JP); Yuichi Sasaki, Hanno (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/775,145

(22) Filed: Feb. 11, 2004

(65) Prior Publication Data
US 2004/0154540 A1    Aug. 12, 2004

(30) Foreign Application Priority Data
Feb. 12, 2003    (JP) .................................. 2003-033630

(51) Int. Cl.
*C23F 1/00* (2006.01)
*H01L 21/306* (2006.01)
*C23C 16/00* (2006.01)

(52) U.S. Cl.
USPC .................................. 156/345.44; 118/723 E (58) Field of Classification Search
USPC ........... 156/345.43, 345.44, 345.47; 118/715, 118/722, 723 R, 723 E
See application file for complete search history.

(56) References Cited

U.S. PATENT DOCUMENTS

| | | | |
|---|---|---|---|
| 5,210,466 A | * | 5/1993 | Collins et al. ............. 315/111.21 |
| 5,643,364 A | | 7/1997 | Zhao et al. |
| 6,089,181 A | * | 7/2000 | Suemasa et al. .......... 118/723 E |
| 6,242,360 B1 | * | 6/2001 | Fischer et al. ................. 438/710 |

(Continued)

FOREIGN PATENT DOCUMENTS

| | | |
|---|---|---|
| EP | 1193746 A1 | 4/2002 |
| JP | 2000-156370 | 6/2000 |

(Continued)

OTHER PUBLICATIONS

Japanese Office Action issued on Jan. 22, 2008 with English translation.

(Continued)

*Primary Examiner* — Maureen Gramaglia
(74) *Attorney, Agent, or Firm* — Smith, Gambrell & Russell, LLP (57) ABSTRACT

A plasma processing unit of the present invention includes a processing container whose inner pressure can be reduced, a first electrode arranged in the processing container, a process gas supplying unit that supplies a process gas into the processing container, a high-frequency electric power source that outputs high-frequency electric power having a frequency in a VHF band, a matching unit electrically connected to the high-frequency electric power source and the first electrode for impedance matching, and a transmission line that transmits the high-frequency electric power from the high-frequency electric power source to the matching unit. A substrate to be processed is adapted to be arranged in the processing container. The high-frequency electric power transmitted to the first electrode is adapted to generate plasma in such a manner that the substrate to be processed can undergo a plasma process by means of the plasma. The transmission line has a length shorter than a length wherein a resonance state of a third harmonic wave of the high-frequency electric power may be generated.

25 Claims, 4 Drawing Sheets

(56) References Cited

U.S. PATENT DOCUMENTS

| | | | |
|---|---|---|---|
| 6,411,490 B2 * | 6/2002 | Dible | 361/234 |
| 6,642,149 B2 | 11/2003 | Suemasa et al. | |
| 6,703,080 B2 * | 3/2004 | Reyzelman et al. | 427/445 |
| 6,817,377 B1 * | 11/2004 | Reimer et al. | 137/565.23 |
| 6,887,339 B1 * | 5/2005 | Goodman et al. | 156/345.28 |
| 7,112,926 B2 | 9/2006 | Himori et al. | |
| 2002/0134508 A1 * | 9/2002 | Himori et al. | 156/345.44 |
| 2003/0056901 A1 * | 3/2003 | Nakano et al. | 156/345.47 |
| 2003/0094239 A1 * | 5/2003 | Quon et al. | 156/345.51 |
| 2005/0011452 A1 | 1/2005 | Hayami et al. | |

FOREIGN PATENT DOCUMENTS

| | | |
|---|---|---|
| JP | 2001-118700 | 4/2001 |
| TW | 462092 | 11/2001 |
| WO | WO 0195352 A2 * | 12/2001 |
| WO | 03/046959 | 6/2003 |

OTHER PUBLICATIONS

Japanese Office Action issued on Nov. 17, 2010 for Japanese Patent Application No. 2008-208076 with English translation.

Taiwanese Office Action received in TW 93103202. Mailed Mar. 8, 2010 and English summary of Taiwanese Office Action.

Search Report received in TW 93103202 Mailed Mar. 8, 2010 and English translation.

* cited by examiner

RESONANCE CONDITION $$s = \frac{n}{2}\lambda \quad (n=1, 2, 3, \cdots)$$

FIG. 3

RESONANCE CONDITION $$s = \frac{2n+1}{4}\lambda \quad (n=1, 2, 3, \cdots)$$

FIG. 4

PRIOR ART

F I G. 5

PLASMA PROCESSING UNIT AND HIGH-FREQUENCY ELECTRIC POWER SUPPLYING UNIT

FIELD OF THE INVENTION

The present invention relates to a technique for conducting a plasma process to a substrate to be processed, in particular to a plasma processing unit wherein high-frequency (radio frequency) electric power in a VHF band is used for generating plasma, and a high-frequency electric power supplying unit for the plasma processing unit.

DESCRIPTION OF THE RELATED ART

Conventionally, in manufacturing processes of semiconductor devious or FPD (Flat Panel Display), many plasma processing units are used for an etching process, a deposition process, an oxidation process, a sputtering process, or the like. In a general type of plasma processing unit, a pair of electrodes is arranged in parallel to each other in a processing container or a reaction chamber. A process gas is introduced into a space between the pair of electrodes, and high-frequency electric power for generating plasma is supplied to one of the electrodes via a matching unit from a high-frequency electric power source. Thus, a high-frequency electric field is formed between the electrodes, electrons are, accelerated, and the electrons and the process gas collide to generate the plasma. Herein, the matching unit functions to match load impedance on a load (in particular, plasma) side with output of the high-frequency electric power source or transmission impedance. In order to make power loss on the load side as small as possible, the matching unit is usually arranged closes to the processing container. On the other hand, the high-frequency electric power source is usually installed in a power supply room or on a rack, which is away from a clean room including the processing container, as an auxiliary machine. In general, there is a distance of about 5 m to 20 m from the high-frequency electric power source to the matching unit. They are connected by a high-frequency transmission line such as coaxial cable.

Recently, high-density plasma under a low pressure is required in the plasma process in order to cope with miniaturization in design rule in manufacturing process. In the above high-frequency discharging type of plasma processing unit, high-frequency electric power in a VHF band (30 MHz to 300 MHz) has recently been used. This frequency is higher than conventional one, which is in general 27 MHz or lower.

As described above, in the high-frequency discharging type of plasma processing unit, regarding the frequency (basic frequency or transmission frequency) of the high-frequency electric power supplied from the high-frequency electric power source, since the impedance is matched with the load impedance on the load (plasma) side by the matching unit, reflected waves from the load side are stopped at the matching unit. That is, in principle, it is prevented that the reflected waves go back to the high-frequency electric power source.

However, the plasma is non-linear load, and may generate harmonic waves (harmonics). The matching unit can't achieve sufficient matching for such harmonic waves. Thus, the harmonic waves from the load side may be passed through the matching unit to the high-frequency electric power source. Then, forward and, reflected harmonic waves may be together on the transmission line between the high-frequency electric power source and the matching unit, so that standing waves may be generated when a standing wave of the harmonic wave is generated on the transmission line for the high-frequency electric power, that is, when a resonance state is formed, characteristics of plasma generation and plasma distribution in the processing container may change indefinitely. This may lower duplicability and/or reliability of the process.

Figure 5:
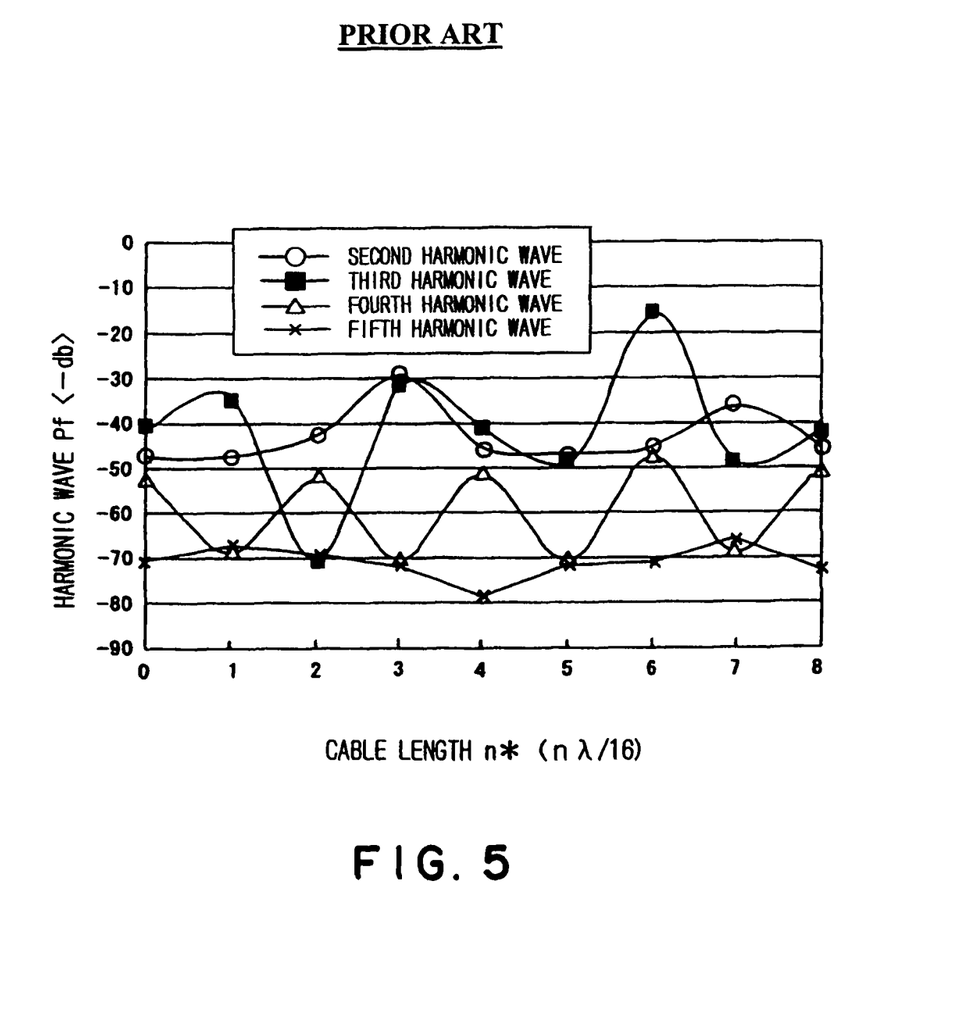
FIG. 5 is a graph showing output levels of harmonic waves generated in a conventional plasma processing unit wherein a length of a transmission line between a high-frequency electric power source and a matching unit is changed in turn by $\frac{1}{16}$ of a wavelength corresponding to the frequency of 100 MHz.

Among the above undesired harmonic waves, second harmonic wave and third harmonic wave nay have a substantial effect on the process characteristics. FIG. 5 shows output levels of harmonic waves generated in a conventional plasma processing unit wherein a high-frequency electric power of 100 MHz is used for generating plasma, a cable DMR900 (5 m) is used as a transmission line between a high-frequency electric power source and a matching unit, length of the cable is changed every $1/16$ of a wavelength $\lambda$ corresponding to the frequency of 100 MHz ($\lambda$=3000 mm). As seen from the graph of FIG. 5, the output levels of second harmonic wave and third harmonic wave are high, in particular the output level of third harmonic wave is extremely increased because of resonance.

SUMMARY OF THE INVENTION

This invention is, developed by focusing the aforementioned problems in order to resolve them effectively. An object of the present invention is to provide a plasma processing unit and a high-frequency electric power supplying unit wherein resonance of a harmonic wave from plasma is surely prevented on a transmission line for transmitting high-frequency electric power in a VHF band, thus change in characteristics of plasma distribution is prevented and duplicability and reliability of process are guaranteed.

The present invention is a plasma processing unit comprising: a processing container whose inner pressure can be reduced; a first electrode arranged in the processing container; a process gas supplying unit that supplies a process gas into the processing container; a high-frequency electric power source that outputs high-frequency electric power having a frequency in a VHF band; a matching unit electrically connected to the high-frequency electric power source and the first electrode for impedance matching; and a transmission line that transmits the high-frequency electric power from the high-frequency electric power source to the matching unit; wherein a substrate to be processed is adapted to be arranged in the processing container; the high-frequency electric power transmitted to the first electrode is adapted to generate plasma in such a manner that the substrate to be processed can undergo a plasma process by means of the plasma; and the transmission line has a length shorter than a length wherein a resonance state of a third harmonic wave of the high-frequency electric power may be generated.

In addition, the present invention is a high-frequency electric power supplying unit that supplies high-frequency electric power having a frequency in a VHF band to a first electrode arranged in a processing container whose inner pressure can be reduced, comprising: a high-frequency electric power source that outputs the high-frequency electric power; a matching unit electrically connected to the high-frequency electric, power source and the first electrode for impedance matching; and a transmission line that transmits the high-frequency electric power from the high-frequency electric power source to the matching unit; wherein the transmission line has a length shorter than a length wherein a resonance state of a third harmonic wave of the high-frequency electric power may be generated.

If one end of a transmission line for transmitting high-frequency electric power (electromagnetic wave) is an electrically short-circuited or open end, the high-frequency electric voltage or current is reflected by the end, so that the forward wave and the reflected wave are mixed on the transmission line. Thus, a standing wave may be generated. If both ends of the transmission line are electrically short-circuited or open ends, the standing wave may be stronger. Furthermore, if the length of the transmission line satisfies a resonance condition with respect to a predetermined frequency (wavelength), the electromagnetic wave of the predetermined frequency generates a resonance state.

In the present invention, the high-frequency electric power source is arranged close to the matching unit so that the length of the transmission line between them is shorter than a shortest length wherein a resonance condition of a third harmonic wave of the transmission frequency (high-frequency electric power) can be satisfied. Therefore, no resonance may be generated with respect to both the second harmonic wave and the third harmonic wave. Herein, it is unnecessary to think of a fourth or higher harmonic wave because even if a resonance thereof is generated, output level thereof is too low to have a bad effect on plasma distribution and plasma characteristics.

In a preferable embodiment of the present invention, the length of the transmission line is shorter than $\lambda/2$, $\lambda$ being a wavelength of the third harmonic wave of the high-frequency electric power, and with respect to the third harmonic wave of the high-frequency electric power, an output terminal of the high-frequency electric power source and an input terminal of the matching unit are electrically short-circuited ends, respectively. If both ends of the transmission line are electrically short-circuited ends, a resonance of the third harmonic wave may be generated when $S=n\lambda/2$ ($n=1, 2, 3, \ldots$) is satisfied, S being the length of the transmission line. Herein, the shortest length for satisfying the resonance condition is $S=\lambda/2$. Thus, when the length of the transmission line is set shorter than $\lambda/2$, no resonance can be generated with respect to both the second harmonic wave and the third harmonic wave.

In another preferable embodiment of the present invention, the length of the transmission line is shorter than $3\lambda/4$, $\lambda$ being a wavelength of the third harmonic wave of the high-frequency electric power, and with respect to the third harmonic wave of the high-frequency electric power, an output terminal of the high-frequency electric power source is an electrically short-circuited end while an input terminal of the matching unit is an electrically open end. If one end of the transmission line is an electrically short-circuited end and the other end is an electrically open end, a resonance of the third harmonic wave may be generated when $S=(2n+1)\lambda/4$ ($n=1, 2, 3, \ldots$) is satisfied, S being the length of the transmission line. Herein, the shortest length for satisfying the resonance condition is $S=3\lambda/4$. Thus, when the length of the transmission line is set shorter than $3\lambda/4$, no resonance can be generated with respect to both the second harmonic wave and the third harmonic wave.

Preferably, the high-frequency electric power source includes a high-frequency electric power generating part that generates the high-frequency electric power when direct-current power is supplied thereto, and a filter that selectively allows the high-frequency electric power from the high-frequency electric power generating part to pass therethrough, and the filter has an output terminal connected to the transmission line as an electrically short-circuited end with respect to the harmonic wave of the high-frequency electric power.

In the case, it is preferable that the high-frequency electric power source further includes a circulator that allows a forward wave from the high-frequency electric power generating part to pass therethrough and that absorbs a reflected wave from the matching unit, between the high-frequency electric power generating part and the filter.

Furthermore, in the case, it is preferable that the high-frequency electric power generating part is connected via a cable to a direct-current power source that converts alternating-current power of commercial frequency into the direct-current power. In addition, in the case, it is preferable that the processing container, the matching unit and the high-frequency electric power generating part are arranged in a common clean room while the direct-current power source is arranged in a power supply room away from the clean room.

As described above, when the high-frequency electric power source (in particular, the high-frequency electric power generating part) is arranged close to the matching unit on the side of the processing container in the clean room, the length of the high-frequency transmission line connecting them is made shorter, and a long cable is used between the high-frequency electric power source (in particular, the high-frequency electric power generating part) and the direct-current power source in the power supply room, power loss in the whole RF system can be remarkably reduced.

Typically, a second electrode is arranged in the processing container in parallel with and opposed to the first electrode.

In the case, in a preferable embodiment, the substrate to be processed is adapted to be placed on the first electrode, and a vent hole, is provided in the second electrode to jet out the process gas toward the first electrode. Alternatively, the substrate to be processed is adapted to be placed on the second electrode, and a vent hole is provided in the first electrode to jet out the process gas toward the second electrode.

In addition, in order to generate high-density plasma under a low-pressure condition, it is preferable that the frequency of the high-frequency electric power is not less than 70 MHz.

DESCRIPTION OF THE PREFERRED EMBODIMENT

Hereinafter, embodiments of the present invention will be described in detail based on the attached drawings.

Figure 1:
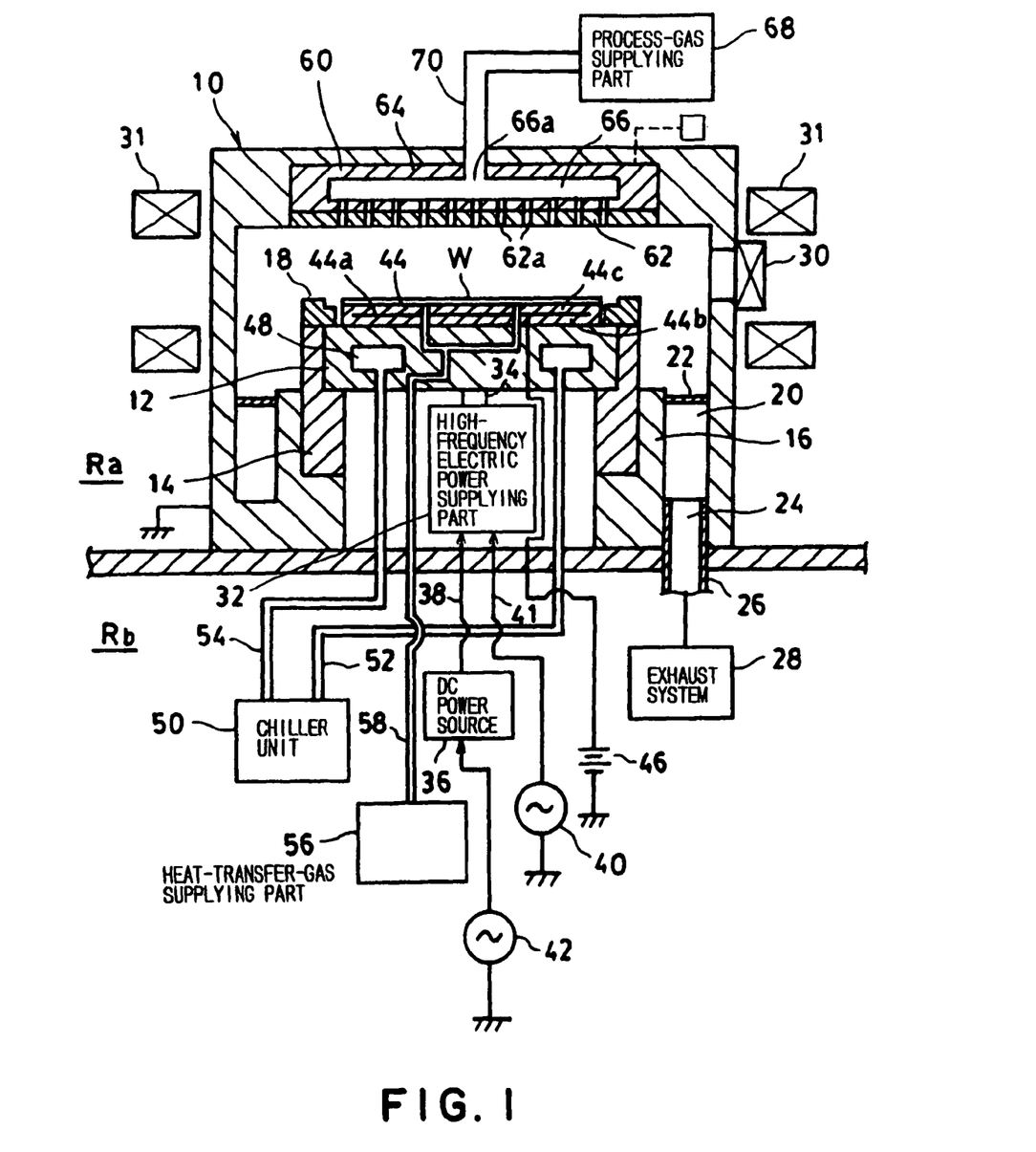
FIG. 1 is a schematic vertical sectional view showing a structure of a plasma processing unit in an embodiment according to the present invention.

FIG. 1 shows a structure of a plasma processing unit in an embodiment according to the present invention. The plasma processing unit is formed as an RIE (Reactive Ion Etching) type of plasma etching unit, and has a cylindrical chamber (processing container), 10 made of a metal such as aluminum or stainless steel. The chamber 10 is installed in a clean room Ra in which particles of 0.1 μm order are controlled not more than 100 per 0.0283 m³ (1 cubic feet), and is protectively grounded.

A disk-like lower electrode or susceptor 12 is provided in the chamber 10 for placing a substrate to be processed such as a semiconductor wafer W thereon. The susceptor 12 is made of for example aluminum, and supported by a tubular supporting part 16 that extends upwardly from a bottom of the chamber 10, via a tubular holding part 14 having insulation properties. A focus ring 18 made of for example quartz is arranged on an upper surface of the tubular holding part 14 so as to surround an upper surface of the susceptor 12.

An exhaust way 20 is ford between a lateral wall of the chamber 10 and the tubular supporting part 16. An annular baffle plate 22 is mounted at an inlet part or on the way of the exhaust way 20. An exhaust port 24 is provided at a bottom of the exhaust way 20. The exhaust port 24 is connected to an exhaust system 26 via an exhaust pipe 26. The exhaust system 28 is installed in a downstairs power supply room Rb away from the clean room Ra. When a vacuum pump of the exhaust system 29 is driven, a processing space in the chamber 10 is vacuumed to a predetermined vacuum level. A gate valve 30 is mounted at the lateral wall of the chamber 10 in order to open and close a transfer port for the semiconductor wafer W. Annular or concentric magnets 31 are arranged around the chamber 10.

A high-frequency electric power supplying part 32, which supplies high-frequency electric power for generating plasma and high-frequency electric power for RIE to the susceptor 12 through a back surface thereof via a power supply rod 34, is provided in the tubular supporting part 16. Direct-current power for generating the plasma is supplied from a direct-current power source 36, which is installed in the downstairs roan (power supply room Rb), to the high-frequency electric power supplying part 32 via a cable 38. In addition, high-frequency electric power for RIE is supplied from a high-frequency electric power source 40, which is also installed in the downstairs room (power supply room Rb), to the high-frequency electric power supplying part 32 via a cable 41. The direct-current power source 36 is adapted to convert alternating-current power of commercial frequency put in from a commercial alternating-current power source 42 thereinto, into the direct-current power, to amplify it and to output it. Detailed structure and operation of the high-frequency electric power supplying part 32 is described below.

An electrostatic chuck 44 is provided on an upper surface of the susceptor 12 for holding the semiconductor wafer W by means of an electrostatic absorption force. The electrostatic chuck 44 is formed by a pair of insulation films 44b, 44c, and an electrode 44a consisting of a conductive film sandwiched between the pair of insulation films 44b, 44c. The electrode 44a is electrically connected to a direct-current power source 46, which is also installed in the downstairs room (power supply room Rb), via a cable or a conductive rod or the like. The semiconductor wafer W is absorbed and held by the chuck 44 because of a Coulomb attraction caused by a direct-current voltage from the direct-current power source 46.

A refrigerant-room 48 that cylindrically extends is provided in the susceptor 12. A refrigerant of a predetermined temperature, for example cooling water, is supplied in circulation from a chiller unit 50 in the downstairs room (power supply room Rb) to the refrigerant-room 46 via pipes 52, 54. A process temperature of the semiconductor wafer W on the electrostatic chuck 44 can be controlled by the temperature of the refrigerant. In addition, A heat transfer gas, for example He gas, from a heat-transfer-gas supplying part 56 in the downstairs room (power supply room Rb) is supplied to a gap between an upper surface of the electrostatic chuck 44 and a reverse surface of the semiconductor wafer W via a gas supplying line 58.

A showerhead 60 is provided at a ceiling part of the chamber 10, oppositely to the susceptor 12, as an upper electrode being grounded. The showerhead 60 has: a lower electrode plate 62 having a large number of vent holes or gas-jetting holes 62a, and a electrode supporting member 64 that detachably supports the electrode plate 62. A buffer room 66 is provided in the electrode supporting member 64. A gas introducing port 66a of the buffer room 66 is connected to a gas supplying pipe 70 from a process-gas supplying part 68.

In the power supply room Rb, a controlling part (not shown) for controlling operations of the respective components (the exhaust system 28, the high-frequency electric power supplying unit 32, the chiller unit 50, the heat-transfer-gas supplying part 56, the process-gas supplying part, and so on) of the plasma etching unit may be also provided.

In order to conduct an etching process by using the above plasma etching unit, the gate valve 30 is opened, a semiconductor wafer W to be processed is conveyed into the chamber 10, and placed on the electrostatic chuck 44. Then, an etching gas (in general a mixed gas) is introduced from the process-gas supplying part 68 into the chamber 10 at a predetermined flow rate (a predetermined amount of flow and a predetermined rate of components), and the pressure in the chamber 10 is adjusted to a set value by means of the exhaust system 28. In addition, high-frequency electric power of 100 MHz of a predetermined power for generating the plasma and high-frequency electric power of 3.2 MHz, for example, of a predetermined power for RIE are supplied from the high-frequency electric power supplying unit 32 to the susceptor 12. In addition, direct-current electric voltage is applied from the direct-current power source 46 to the electrode 44a of the electrostatic chuck 44, so that the semiconductor wafer W is fixed onto the electrostatic chuck 44. The etching gas jetted from the showerhead 60 is made plasma by means of high-frequency electric discharge between the electrodes 12 and 60. Radicals and ions generated in the plasma etch the main surface of the semiconductor wafer W.

In the above plasma etching unit, the high-frequency electric power in a VHF band (preferably not lower than 70 MHz) is applied to the susceptor (lower electrode) 12. The frequency is higher than conventional frequency (in general not higher than 27 MHz). Thus, the plasma density may be enhanced with a preferable dissociate state, so that high-density plasma may be generated even under a lower pressure condition.

While the plasma is generated in the chamber 10, harmonic waves generated by the plasma are transferred to the high-frequency electric power supplying unit 32. Thus, a standing wave may be generated on a transmission line in the high-frequency electric power supplying unfit 32. However, as described below, this embodiment has a structure to surely prevent generation of the standing wave (resonance state) of second harmonic wave or third harmonic wave which may have an effect on the process. Thus, this embodiment can achieve a plasma etching process with high duplicability and high reliability.

Figure 2:
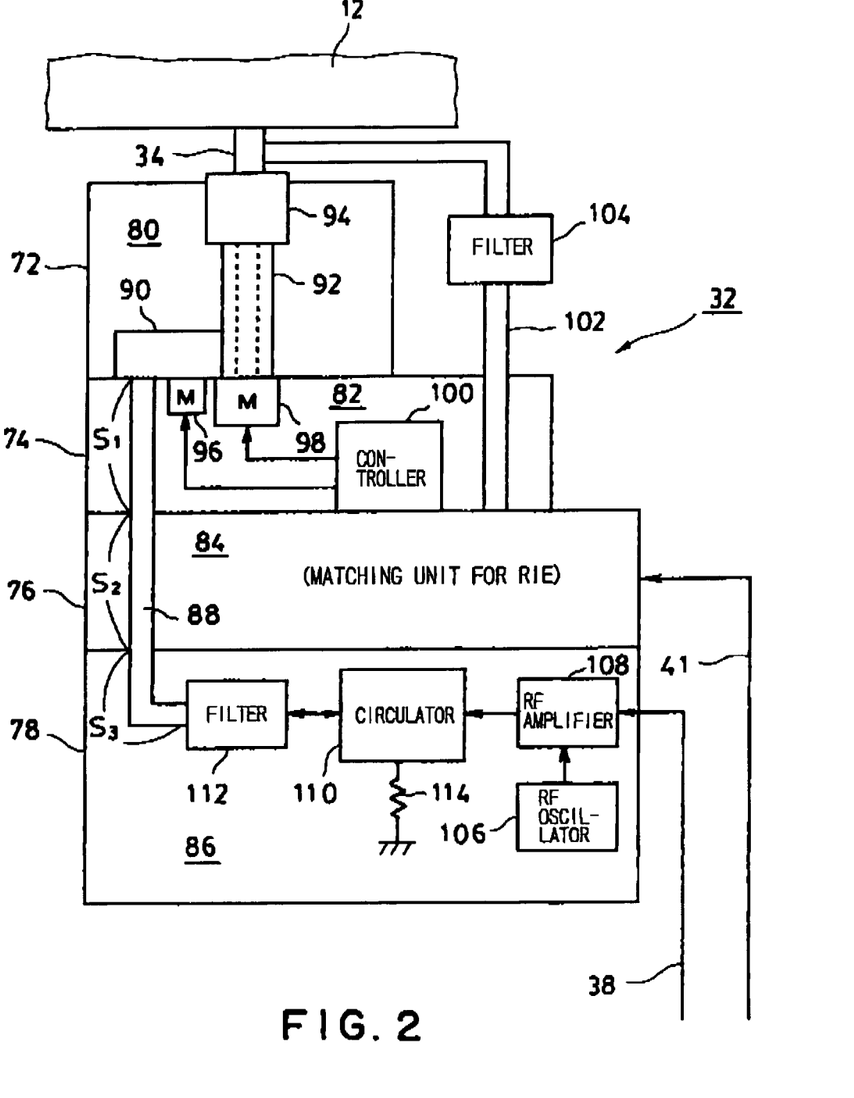
FIG. 2 is a schematic view showing a structure of the high-frequency electric power supplying part in the plasma processing unit of FIG. 1.

Next, a structure and an operation of the high-frequency electric power supplying part 32 of the above plasma etching unit are explained.

As shown in FIG. 2, the high-frequency electric power supplying part 32 has four housings or boxes 72, 74, 76, 78 that are vertically stacked. A matching unit 80 for generating the plasma is contained in the uppermost box 72. A matching controller 82 is contained in the second uppermost box 74. A matching box 84 for RIE (details are omitted) is contained in the third uppermost box 76. A high-frequency electric power source 56 for generating the plasma is contained in the lowermost box 78. An output terminal of the high-frequency electric power source 86 is connected to an input terminal of the matching unit 90 for generating the plasma, via a high-frequency transmission line such as a coaxial tube 88.

In the uppermost box 72, the matching box 80 for generating the plasma forms a matching circuit network for matching load (in particular, plasma) impedance with output of the high-frequency electric power source 86 or transmission impedance. Herein, the matching unit 80 has: an input part 90 connected to the coaxial tube 88; a resonance rod 92 electrically connected to the input part 90 by for example an inductive coupling; and a variable capacitor 94 connected between the resonance rod 92 and the power supply rod 34.

The input part 90 includes, for example, a variable capacitor (not shown), and a link coil (not shown) for an inductive coupling to the resonance rod 92. In the embodiment, one terminal of the variable capacitor in the input part 90 is connected to a ground potential, so that the input terminal of the input part 90 connected to one end of the coaxial tube 88 may be considered as an electrically short-circuited end.

In the second top box 74, the matching controller 82 has actuators 96, 98 respectively including motors, and a controller 100 for controlling the actuators 96, 98. The motors of the actuators 96, 98 respectively serve for adjusting respective capacitance values of the variable capacitor of the input part 90 and the variable capacitor 94 on the output side, in order to control imaginary part of impedance or reactance.

In the third box 76, the matching unit 84 for RIE forms a matching circuit for matching load (in particular, plasma) impedance with output of the high-frequency electric power source 40 (FIG. 1) or transmission impedance. An output terminal of the matching unit 84 is connected to the power supply rod 34, via a high-frequency transmission line such as a coaxial tube 102. A filter 104 for cutting off or removing frequency components without the transmission frequency (3.2 MHz) is provided on the way of the transmission line 102.

In the lowermost box 78, the high-frequency electric power source 86 has an RF oscillator 106, an RF amplifier 108, a circulator 110 and a filter 112. The RF oscillator 106 generates a high-frequency signal defining a frequency (100 MHz) of the high-frequency electric power for generating the plasma. The RF amplifier 108 has a switching device consisting of, for example, FET, and generates high-frequency electric power of 100 MHz by amplification operation of the high-frequency signal from the RF oscillator 106 when direct-current power is applied from the direct-current power source 36 (FIG. 1) via the direct-current transmission cable 38 of, for example, 5 m to 20 m. The circulator 110 functions as an isolating circuit, that is, allows the high-frequency electric power (forward wave) from the RF amplifier 108 to pass therethrough with no substantial attenuation, but causes reflected waves from the matching unit 80 to flow in a dummy load resistance 114 to absorb them. The filter 112 selectively allows the high-frequency electric power from the circulator 110 to pass therethrough but shuts off or removes frequency components above the transmission frequency (100 MHz).

The coaxial tube 88 vertically extends through the second and third boxes 74, 76, between the output terminal of the filter 112 of the high-frequency electric power source 86 and the input terminal of the input part 90 of the matching unit 80. For example, partial lengths of the coaxial tube 88 may be $S_1$=150 mm, $S_2$=150 mm and $S_3$=100 mm, $S_1$ being a partial length corresponding to the box 74, $S_2$ being a partial length corresponding to the box 76 and $S_3$ being a partial length corresponding to the box 78. Then, the total length S of the coaxial tube 88 may be 400 mm.

In the high-frequency-electric power supplying part 32, in order to generate the plasma between the showerhead (upper electrode) 60 in the chamber 10 and the susceptor (lower electrode) 12, the direct-current power transmitted from the direct-current power source 36 (FIG. 1) in the power supply room Rb via the cable 38 is converted to high-frequency electric power of a desired frequency (for example 100 MHz) in a VHF band by the high-frequency electric power source 86, then the high-frequency electric power produced from the high-frequency electric power source 86 is put in to the matching unit 80 via the coaxial tube 88, and the high-frequency electric power is supplied from the matching unit 80 to the susceptor 12 via the power supply rod 34. The matching unit 80 adjusts impedance of itself, in particular imaginary part or reactance component, under a control by the matching controller 82, and serves to match the load (in particular, plasma) impedance with the output of the high-frequency electric power source 86 or the transmission impedance with respect to the transmission frequency (100 MHz), that is, to form a serial resonance circuit. Because of such matching function of the matching unit 80, the high-frequency electric power (100 MHz) for generating the plasma can be supplied to the plasma in the chamber 10 with maximum or intrinsic power of the high-frequency electric power source 86, while the reflected waves from the plasma are stopped by the matching unit 80 so that they may not be transmitted to the high-frequency electric power source 86.

In addition, in the high-frequency electric power supplying part 32, since the high-frequency electric power source 86 is arranged close to the matching unit 80, and the length S of the coaxial tube 88 between the output terminal of the high-frequency electric power source 86 and the input terminal of the matching unit 80 is 400 mm (more precisely, the length S is shorter than $\lambda/2$ (500 mm), $\lambda$ being a wavelength (1000 mm) of the third harmonic wave (300 MHz) of the transmission frequency (100 MHz)), generation of resonance state of the second or third harmonic wave can be surely prevented on the coaxial tube 88.

In detail, the matching function of the matching unit 80 is not effective for the harmonic waves generated from the plasma in the chamber 10. Thus, the harmonic waves pass through the matching unit 80 and go in the coaxial tube 88. The harmonic waves transmitted toward the high-frequency electric power source 86 on the coaxial tube 88 are reflected at one end of the coaxial tube 88, that is, at the output terminal of the filter 112 being a substantially electrically short-circuited end. Then, the harmonic waves reflected at the output terminal of the filter 112 are reflected at the other end of the coaxial tube 88, that is, at the input terminal of the input part 90 being a substantially electrically short-circuited end. Thus, the forward waves and the reflected waves of the harmonic waves exist together on the coaxial tube 88, which may generate a standing wave. Herein, among the harmonic waves, the second harmonic wave (200 MHz) and the third harmonic waves (300 MHz) may have a substantial bad effect on the process in the chamber 10. A fourth (400 MHz) or higher harmonic wave doesn't have a substantially bad effect even if a resonance thereof is generated.

Figure 3:
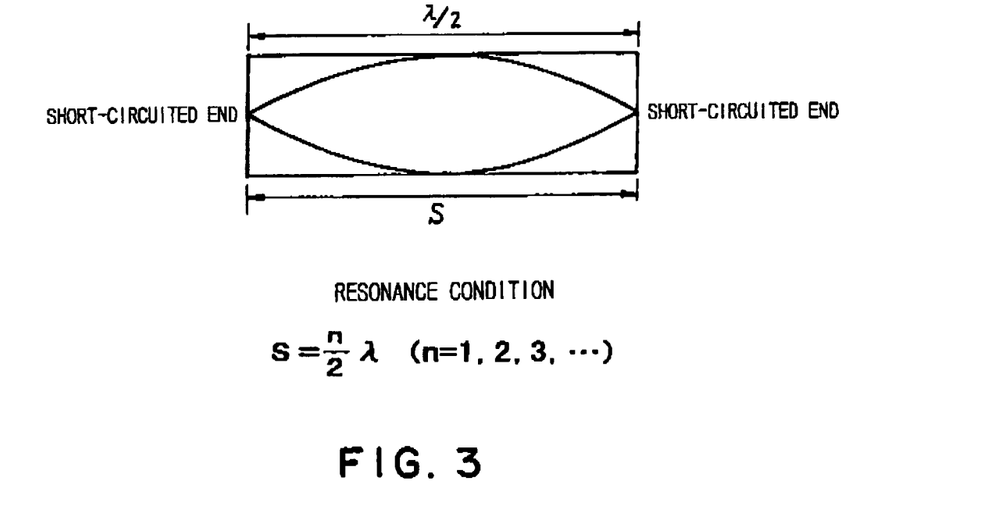
FIG. 3 is a view showing a resonance condition on a transmission line whose both ends are electrically short-circuited ends.

Then, as shown in FIG. 3, a condition wherein a resonance of electromagnetic wave is generated when both ends of the transmission line are electrically short-circuited ends is that the length S of the transmission line is equal to a multiple of $\lambda/2$, that is, $n\lambda/2$ (n=1, 2, 3, . . . ), $\lambda$ being a wavelength of the electromagnetic wave. Thus, electromagnetic wave of 300

MHz having a wavelength of 1000 mm generates a resonance state when the above resonance condition is satisfied on a transmission line whose length is not less than 500 mm. In addition, electromagnetic wave of 200 MHz having a wavelength of 1500 mm generates a resonance state when the above resonance condition is satisfied on a transmission line whose length is not less than 750 mm.

Herein, in the high-frequency electric power supplying part 32 of the above embodiment, the length S of the coaxial tube 88 connecting the output terminal of the high-frequency electric power source 86 and the input terminal of the matching unit 80 is set to 400 mm (less than 500 mm). Thus, with respect to both the second harmonic wave (200 MHz) and the third harmonic wave, (300 MHz), the above resonance condition can not be satisfied on the coaxial tube 88. That is, no resonance may be generated with respect to both the second harmonic wave and the third harmonic wave.

As described above, in the high-frequency electric power supplying part 32 of the above embodiment, the high-frequency electric power source 86 is arranged close to the matching unit 80 so that the length S of the high-frequency transmission line i.e. the coaxial tube 88 between them is shorter than the shortest length (500 mm) wherein a resonance state of a third harmonic wave (300 MHz) can be generated. Therefore, resonance of the second or third harmonic wave, which may have a bad effect on plasma distribution characteristics or the process in the chamber 10, may be surely prevented.

In addition, in the embodiment, the direct-current power source 36 is arranged in the power supply room Rb, and the high-frequency electric power source 86 is contained together with the matching unit 80 in the high-frequency electric power supplying part 32 close to the chamber 10 in the clean room Ra. The cable 38 is used for the direct-current transmission of the long distance (about 5 m to 20 m) from the direct-current power source 36 to the high-frequency electric power source 86. The coaxial tube 88 is used for the high-frequency transmission of the short distance (less than 500 mm) from the high-frequency electric power source 86 to the matching unit 80.

In both the direct-current transmission and the high-frequency transmission, if the length of the transmission line is longer, power loss is more. However, the power loss per unit length of the high-frequency transmission is several times as much as that of the direct-current transmission.

In order to transmit the electric power for generating the plasma from the power supply room Rb to the matching unit 80 installed close to the chamber 10 in the clean room Ra, according to the conventional manner, high-frequency electric power of a desired frequency (100 MHz) is generated in the power supply unit Rb, and then the high-frequency electric power is transmitted to the matching unit 80 via a high-frequency transmission line of a long distance (in general 5 m to 20 m) on the other hand, according to the embodiment, the direct-current power generated by the direct-current power source 36 in the power supply room Rb is transmitted to the high-frequency electric power source 86 close to the chamber 10 via the direct-current transmission line 38 of a long distance (about 5 m to 20 m), and high-frequency electric power of a desired frequency (100 MHz) generated by the high-frequency electric power source 86 is transmitted to the matching unit 80 via the high-frequency transmission line 88 of a short distance (less than 500 mm). Therefore, in the embodiment, the power loss in the total RF system can be remarkably reduced.

A flexible power cable for direct-current or a low frequency may be used as the direct-current transmission line 38 from the power supply room Rb to the high-frequency electric power source 86 in the clean room Ra. In the case, the cable may be easily handled and arranged, so that the layout of the RF system may be advantageously designed.

In the above embodiment, in the high-frequency electric power supplying part 32, the input terminal of the matching unit 80 is formed as a substantially electrically short-circuited end. However, it may be formed as a substantially open end. In the latter case, if the length S of the coaxial tube 88 connecting the output terminal of the high-frequency electric power source 86 and the input terminal of the matching unit 80 is set shorter than $3\lambda/4$ (750 mm), $\lambda$ being the wavelength (1000 mm) of the third harmonic wave (300 MHz), generation of resonance state of the second and third harmonic wave can be surely prevented.

Figure 4:
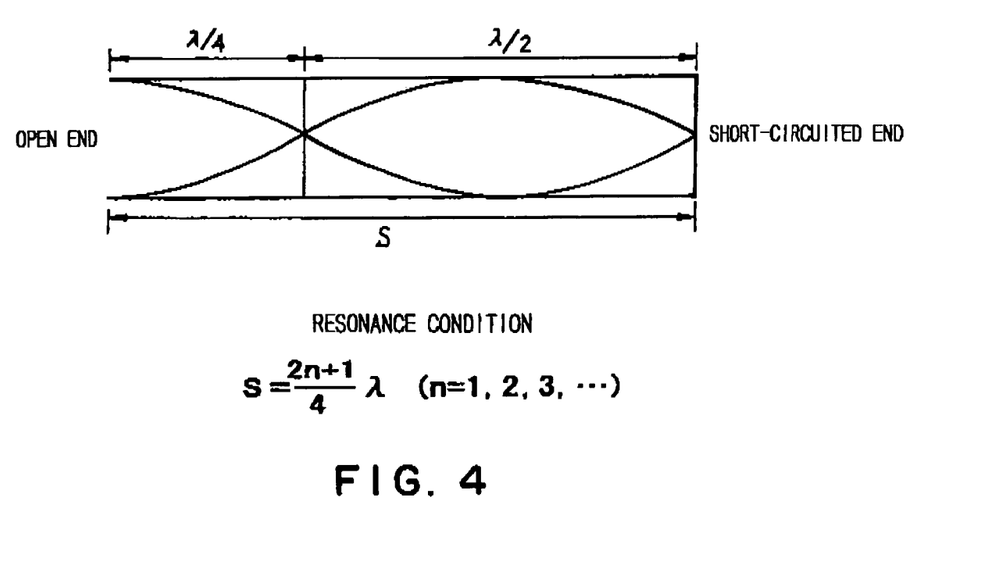
FIG. 4 is a view showing a resonance condition on a transmission line whose one end is an electrically short-circuited end and whose the other end is an electrically open end.

That is, as shown in FIG. 4, a condition wherein a resonance of electromagnetic wave is generated when one end of the transmission line is an electrically short-circuited end and the other end is an open end is that the length S of the transmission line is equal to $(2n+1)\lambda/4$ (n=1, 2, 3, . . . ), $\lambda$ being a wavelength of the electromagnetic wave. Thus, electromagnetic wave of 300 MHz having a wavelength of 1000 mm generates a resonance state when the above resonance condition is satisfied on a transmission line whose length is not lass than 750 mm. In addition, electromagnetic wave of 200 MHz having a wavelength of 1500 mm generates a resonance state when the above resonance condition is satisfied on a transmission line whose length is not less than 1125 mm. Thus, if the length S of the coaxial tube 88 is shorter than 750 mm the above resonance condition can not be satisfied with respect to the second harmonic wave (200 MHz) and the third harmonic wave (300 MHz). That is, no resonance may be generated with respect to both the second harmonic wave and the third harmonic wave.

The electrically short-circuited or open end of the high-frequency transmission line on the side of the high-frequency electric power source 86 and/or the matching unit 80 may be not exactly the end of the coaxial tube 88. The electrically short-circuited or open end may be formed on the transmission line in the high-frequency electric power source 86 and/or the matching unit 80. In the latter case, the above length S of the high-frequency transmission line may also include the length of the high-frequency transmission line from the end of the coaxial tube 88 to the electrically short-circuited or oven end in any transmitting circuit.

In addition, in applications not including reactive ion etching (RIE), the high-frequency electric power supplying part for RIE (40, 84, 104) may be omitted. In the case, in the high-frequency electric power supplying part 32, the box 76 may be omitted. Then, the high-frequency electric power source 86 may be arranged closer to the matching unit 80, so that the length of the high-frequency transmission line (coaxial tube) 88 may be further shortened.

In the plasma etching unit of the above embodiment, the high-frequency electric power for generating the plasma is applied to the susceptor 12. However, as shown by a dotted line in FIG. 1, this invention is also applicable to another type of plasma etching unit wherein high-frequency electric power for generating plasma is applied to the upper electrode 60. In addition, this invention is also applicable to other types of plasma processing unit for, for example, a plasma CVD, a plasma oxidation, a plasma nitridation, a sputtering, or the like.

In addition, in the above embodiment, the semiconductor wafer is taken as an example of the substrate to be processed. However, this invention is not limited thereto, but applicable to various substrates for a flat display panel, photomasks, CD substrates, printed substrates, and the like.

The invention claimed is:

1. A plasma processing system comprising:
   a processing container whose inner pressure can be reduced,
   a first electrode arranged in the processing container, the first electrode being supplied a first high-frequency electric power and a second high-frequency electric power,
   a process gas supplying part that supplies a process gas into the processing container,
   a tubular supporting part that supports the first electrode, the tubular supporting part forming a space together with a bottom surface of the first electrode such that said space is disposed within the tubular supporting part below the first electrode,
   a high-frequency electric power supplying part arranged in the space, and
   a power supply rod connecting the high-frequency electric power supplying part to the first electrode,
   wherein the high-frequency electric power supplying part further comprises:
   a first high-frequency electric power source unit that outputs the first high-frequency electric power having a first frequency, wherein the frequency of the first high-frequency electric power is higher than the frequency of the second high-frequency electric power,
   a first matching unit directly connected to the power supply rod for impedance matching of the first high-frequency electric power,
   a second matching unit for impedance matching of the second high-frequency electric power,
   a coaxial tube and a filter which connect the first electrode to the second matching unit, the filter removing frequencies other than the frequency of the second high-frequency electric power, and
   a transmission line that transmits the first high-frequency electric power from the first high-frequency electric power source unit to the first matching unit, wherein the transmission line is less than 500 mm, and wherein
   the first matching unit is contained in a first housing located just under the first electrode,
   the second matching unit is contained in a third housing located under the first matching unit,
   the first high-frequency electric power supplying part is contained in a fourth housing located under the second matching unit, and
   the first matching unit is arranged closer to the first electrode than the second matching unit is to the first electrode.

2. A plasma processing unit according to claim 1, wherein the length of the transmission line is shorter than $\lambda/2$, $\lambda$ being a wavelength of the third harmonic wave of the high-frequency electric power, and with respect to the third harmonic wave of the high-frequency electric power, an output terminal of the high-frequency electric power source and an input terminal of the matching unit are electrically short-circuited ends, respectively.

3. A plasma processing system according to claim 1, wherein
   the transmission line has a length which is shorter than $3\lambda/4$, $\lambda$ being a wavelength of a third harmonic wave of the first high-frequency electric power, and
   with respect to the third harmonic wave of the first high-frequency electric power, an output terminal of the high-frequency electric power source is an electrically short-circuited end and an input terminal of the first matching unit is an electrically open end.

4. A plasma processing system according to claim 1, wherein
   the first high-frequency electric power source unit comprises:
   a first high-frequency electric power generating part that generates the first high-frequency electric power when direct-current power is supplied thereto, and
   an output filter provided between the transmission line and the first high-frequency electric power generating part, the output filter selectively allowing the first high-frequency electric power from the first high-frequency electric power generating part to pass therethrough.

5. A plasma processing system according to claim 4, wherein
   the first high-frequency electric power source further comprises a circulator that allows a forward wave from the first high-frequency electric power generating part to pass therethrough and that absorbs a reflected wave from the first matching unit, between the first high-frequency electric power generating part and the output filter.

6. A plasma processing system according to claim 4, wherein
   the output filter has an output terminal connected to the transmission line as an electrically short-circuited end with respect to a harmonic wave of the first high-frequency electric power.

7. A plasma processing system according to claim 1, wherein the first frequency is not less than 70 MHz.

8. A plasma processing system according to claim 1, wherein
   a second electrode is arranged in the processing container in parallel with and opposed to the first electrode.

9. A plasma processing system according to claim 8, wherein
   the substrate to be processed is adapted to be placed on the first electrode, and a vent hole is provided in the second electrode to jet out the process gas toward the first electrode.

10. A plasma processing system according to claim 1, wherein
    the transmission line is another coaxial tube.

11. A plasma processing system according to claim 1, wherein
    the first matching unit comprises an input part directly connected to the transmission line, and a resonance rod inductively coupled to the input part to provide the first high-frequency electric power to the power supply rod.

12. A plasma processing system according to claim 11, wherein
    the first matching unit further comprises a variable capacitor connecting the resonance rod to the power supply rod.

13. A plasma processing system according to claim 12, further comprising a second housing and control elements contained within the second housing for controlling the variable capacitor that connects the resonance rod and the power supply rod, the second housing being located between the first housing containing the first matching unit and the third housing containing the second matching unit.

14. A high-frequency electric power supplying apparatus for use in a space in a plasma processing system that includes:
    a processing container whose inner pressure can be reduced;

a first electrode arranged in the processing container, the first electrode being supplied a first high-frequency electric power and a second high-frequency electric power, a process gas supplying apparatus that supplies a process gas into the processing container;

a tubular supporting part that supports the first electrode, the tubular supporting part forming the space together with a bottom surface of the first electrode such that the space is disposed within the tubular supporting part below the first electrode; and a power supply rod that extends from the first electrode into the space;

said high frequency electric power supply apparatus comprising:

a first high-frequency electric power source unit that outputs the first high-frequency electric power at a first frequency, a first matching unit for impedance matching of the first high-frequency electric power, a second matching unit for impedance matching of the second high-frequency electric power, wherein the first frequency of the first high-frequency electric power is higher than a frequency of the second high-frequency electric power, and a transmission line that transmits the first high-frequency electric power from the first high-frequency electric power source unit to the first matching unit, wherein the transmission line is less than 500 mm, and wherein:

the first matching unit is directly connected to the transmission line and directly connected to the power supply rod, the first matching unit is contained in a first housing located just under the first electrode, the second matching unit is contained in a third housing located under the first matching unit, the first high-frequency electric power supplying part is contained in a fourth housing located under the second matching unit, the first matching unit is arranged closer to the first electrode than the second matching unit is to the first electrode, and a coaxial tube and a filter connect the second matching unit and the first electrode, the filter removing frequency components other than the frequency of the second high-frequency electric power.

15. A high-frequency electric power supplying unit according to claim 14, wherein the length of the transmission line is shorter than $\lambda/2$, $\lambda$ being a wavelength of the third harmonic wave of the high-frequency electric power, and with respect to the third harmonic wave of the high-frequency electric power, an output terminal of the high-frequency electric power source and an input terminal of the matching unit are electrically short-circuited ends, respectively.

16. A high-frequency electric power supplying unit according to claim 14, wherein the first high-frequency electric power source comprises:

a first high-frequency electric power generating part that generates the first high-frequency electric power when direct-current power is supplied thereto, and an output filter provided between the transmission line and the first high-frequency electric power generating part, the output filter selectively allowing the first high-frequency electric power from the first high-frequency electric power generating part to pass therethrough.

17. A high-frequency electric power supplying apparatus according to claim 16, wherein the first high-frequency electric power source further comprises a circulator that allows a forward wave from the first high-frequency electric power generating part to pass therethrough and that absorbs a reflected wave from the first matching unit, between the first high-frequency electric power generating part and the output filter.

18. A high-frequency electric power supplying apparatus according to claim 17, wherein the first high-frequency electric power generating part is connected via a cable to a direct-current power source that converts alternating-current power of commercial frequency into the direct-current power.

19. A high-frequency electric power supplying apparatus according to claim 16, wherein the output filter has an output terminal connected to the transmission line as an electrically short-circuited end with respect to a harmonic wave of the first high-frequency electric power.

20. A high-frequency electric power supplying apparatus according to claim 14, wherein the first frequency is not less than 70 MHz.

21. A high-frequency electric power supplying apparatus according to claim 14, wherein the transmission line has a length which is shorter than $3\lambda/4$, $\lambda$ being a wavelength of a harmonic wave of the first high-frequency electric power, and with respect to the third harmonic wave of the first high-frequency electric power, an output terminal of the first high-frequency electric power source is an electrically short-circuited end and an input terminal of the first matching unit is an electrically open end.

22. A high-frequency electric power supplying apparatus according to claim 14, wherein the transmission line is another coaxial tube.

23. A plasma processing system according to claim 14, wherein the first matching unit comprises an input part directly connected to the transmission line, and a resonance rod inductively coupled to the input part to provide the first high-frequency electric power to the power supply rod.

24. A plasma processing system according to claim 23, wherein the first matching unit further comprises a variable capacitor connecting the resonance rod to the power supply rod.

25. A plasma processing system according to claim 24, further comprising a second housing and control elements contained within the second housing for controlling the variable capacitor that connects the resonance rod and the power supply rod, the second housing being located between the first housing containing the first matching unit and the third housing containing the second matching unit.

* * * * *